United States Patent [19]

Symersky

[11] 4,353,935

[45] Oct. 12, 1982

[54] METHOD OF MANUFACTURING A DEVICE HAVING A CONDUCTOR PATTERN

[75] Inventor: Bohuslav Symersky, Nijmegen, Netherlands

[73] Assignee: U.S. Philips Corporation, New York, N.Y.

[21] Appl. No.: 936,616

[22] Filed: Aug. 24, 1978

Related U.S. Application Data

[63] Continuation of Ser. No. 764,589, Feb. 1, 1977, abandoned, which is a continuation of Ser. No. 612,718, Sep. 12, 1975, abandoned.

[30] Foreign Application Priority Data

Sep. 19, 1974 [NL] Netherlands ................. 7412383

[51] Int. Cl.³ ............................... H01L 21/285
[52] U.S. Cl. ............................. 427/89; 156/659.1; 427/90; 427/91; 427/124; 427/259; 430/314
[58] Field of Search ............ 156/659, 659.1; 427/58, 427/88, 89, 90, 91, 124, 125, 259, 282; 430/314

[56] References Cited

U.S. PATENT DOCUMENTS

| | | | |
|---|---|---|---|
| 3,442,701 | 5/1969 | Lepselter | 427/89 |
| 3,498,833 | 3/1970 | Lehrer | 427/259 |
| 3,567,508 | 3/1971 | Cox et al. | 427/91 |
| 3,873,361 | 3/1975 | Franco et al. | 427/88 |
| 4,004,044 | 1/1977 | Franco et al. | 427/259 |
| 4,108,717 | 8/1978 | Widmann | 427/259 |

Primary Examiner—John D. Smith
Attorney, Agent, or Firm—Paul R. Miller

[57] ABSTRACT

The invention relates to a method in which the "lift-off" technique is used for providing a conductor pattern on a substrate, namely that variation of said technique in which a multilayer mask connected to the surface is used.

According to the invention, said technique proves to be particularly suitable to obtain a multilayer conductor pattern the free surface of which of a first conductive sub-layer on the substrate is fully covered by a second conductive sub-layer.

2 Claims, 5 Drawing Figures

METHOD OF MANUFACTURING A DEVICE HAVING A CONDUCTOR PATTERN

This is a continuation of application Ser. No. 764,589, filed Feb. 1, 1977, abandoned, which in turn is a continuation of Ser. No. 612,718, filed Sept. 12, 1975, now abandoned.

The invention relates to a method of manufacturing a device comprising a body which has a conductor pattern in which a masking layer which comprises a first and a second masking sub-layer of materials differing from each other is provided on a surface of the body and in which upon making recesses in the form of the conductor pattern to be provided in the masking layer, the second masking sub-layer is used as an etching mask for the underlying first masking sub-layer, after which a layer of conductive material which comprises several conductive sub-layers of materials differing from each other is provided on the surface and on the masking layer, after which the masking layer and hence the part of the conductive layer present on the masking layer is removed and the part of the conductive layer present in the recesses of the masking layer remains on the body as the conductor pattern, and to a device manufactured by means of the method.

The invention will be described mainly with reference to the manufacture of semiconductor devices but is not restricted to it and can also be applied in the manufacture of, for example, conductor tracks on insulating substrates, of piezoelectric or magnetic devices and in general in those cases in which complicated conductor patterns are to be provided with great accuracy on a substrate.

For providing a conductor pattern by vapor deposition, use was frequently made in the past of a vapor deposition mask consisting of a metal foil having the recesses required for the conductor pattern. Such metal foils are vulnerable, are unfit for vapor depositing complicated conductor patterns, and in order to obtain readily defined conductor tracks, they have to be provided accurately and during the vapor deposition close to the substrate to be provided with the conductor pattern.

Therefore, photomechanical methods have long been used in which a conductor pattern is formed from a continuous conductive layer by means of a photoetching process.

Photoetching processes, however, suffer from the drawback that underetching occurs below a layer of photolacquer used as an etching mask, which is again at the expense of the accuracy and the applicable width of conductors to be formed. In addition, an etching process cannot be used for all metals or combinations of metals.

Underetching is taken advantage of in the method mentioned in the preamble; and with this method a conductor pattern is formed which has exactly the shape of the recesses provided in the masking layer.

When in this case the conductive layer is provided by vapor deposition, the masking layer is again a vapor deposition mask which is formed, for example, photomechanically on the surface of the device but which does not suffer from the drawbacks of the separate vapor deposition mask foil already described above.

A large number of requirements are imposed upon conductor patterns for semiconductor devices, which requirements can usually be satisfied only by using conductors which consist of several sub-layers.

A first sub-layer, for example, should readily adhere to the surface of the device and, for example, form an ohmic connection with it. The requirement is imposed, for example, upon subsequent sub-layers that they should be readily solderable, have a low resistivity, and show substantially no electromigration; a good adhesion to the semiconductor surface is not required for the subsequent sub-layers.

It has been found in practice that it is extremely difficult to choose the composition of the conductor pattern to satisfy all the requirements of good conductor tracks.

This manifests itself in practice, for example, in that conductor tracks and in particular the first conductive sub-layer, especially when in consists of aluminium or titanium, is attacked under the influence of the immediate environment. One of the objects of the invention is to avoid this difficulty at least to a considerable extent.

The invention is based inter alia on the recognition of the fact that attack can be prevented when the conductor pattern, at least the part thereof which is sensitive to attack, can be screened from the atmosphere in a suitable manner.

Therefore, the method mentioned in the preamble is characterized according to the invention in that a first conductive sub-layer is provided on the surface and a second conductive sub-layer is then provided to cover the whole free surface of the underlying first conductive sub-layer.

It has been found that even a second conductive sub-layer which in itself does not show particularly good adhesion properties with respect to a semiconductor surface can particularly readily shield a first conductive sub-layer which is sensitive to attack. Therefore, the first conductive sub-layer material is preferably chosen from the group consisting essentially of aluminum, chromium, titanium, molybdenum, tungsten, cobalt, zirconium and hafnium and the second conductive sub-layer material is chosen from the group consisting essentially of ruthenium, rhodium, palladium, osmium, rhenium, irridium and platinum.

The method according to the invention may be carried out in a particularly simple manner when the two conductive sub-layers are provided at different pressures, the pressure during the provision of the first conductive sub-layer being smaller than the pressure during the provision of the second conductive sub-layer and, for example, the pressure during providing the first conductive sub layer being $10^{-6}$ to $10^{-7}$ Torr and the pressure during formation of the second conductive sub layer being $10^{-2}$ to $10^{-3}$ Torr. The full covering of the first conductive sub-layer in this case is associated with the average free path length which is lower at high pressures than at lower pressures.

Instead of pressure variation, in a variation of the method according to the invention, a larger maximum angle of incidence is used for the material transport to the surface for providing the second conductive sub-layer than for providing the first conductive sub-layer. Angle of incidence is to be understood to mean herein the angle which the direction of the material transport encloses with a normal to the surface to be covered.

A larger angle of incidence can be obtained, for example, by causing the device to perform a planetary movement relative to the vapor deposition source, with which movement a homogeneous covering of the surface is often achieved.

In a preferred embodiment of the method according to the invention the masking layer comprises three masking sub-layers of materials differing from each other, in which, upon masking recesses in the form of the conductor pattern that is to be provided in the masking layer, the third masking sub-layer is used as an etching mask for the underlying second masking sub-layer and the third masking sub-layer serves as a mask during the provision of the first conductive sub-layer; and in which the second masking sub-layer, after removing the third masking sub-layer, serves as a mask for providing the second conductive sub-layer.

In this preferred embodiment, both the first and the second conductive sub-layer can be provided on the surface of the device by vapor-deposition at right angles.

The same material is preferably chosen for the first conductive sub-layer and the first masking sub-layer. In fact it is of importance that not only the first conductive sub-layer which is of metal adheres readily to the surface of the device, but that this is also the case with the first masking sub-layer.

It is just in the method according to the invention that both last-mentioned sub-layers can be of the same composition because upon removal of the first masking sub-layer, removal of the first conductive sub-layer and hence the conductor pattern can be prevented since the first conductive sub-layer is shielded by the second conductive sub-layer.

The invention furthermore relates to a device manufactured by means of the method according to the invention.

The invention will now be described in greater detail with reference to a few examples and the accompanying drawing.

Figure 1:
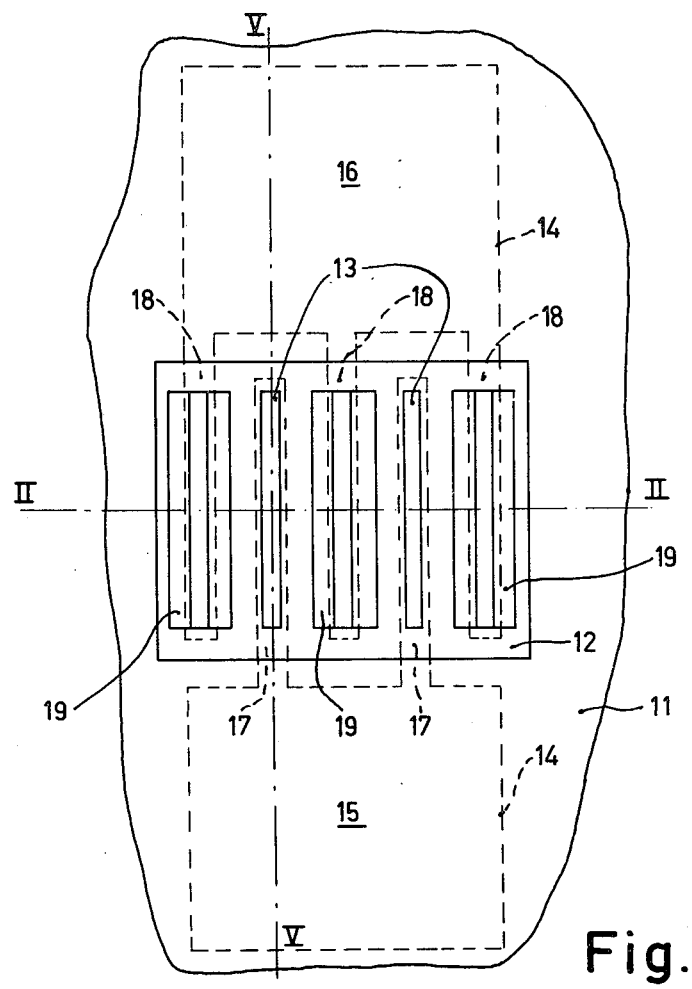
FIG. 1 is a diagrammatic plan view of a semiconductor device manufactured by means of the method according to the invention.

The first embodiment relates to the manufacture of a planar high frequency transistor the diagrammatic plan view of which is shown in FIG. 1. The transistor comprises a collector zone 11, a base zone 12 and two emitter zones 13. A conductor pattern 14 which has contact pads 15 and 16 for the adhesion of connection conductors for the emitter and base, respectively, is shown diagrammatically by broken lines. The contact pads each have a number of extensions or digits 17 and 18, respectively, which are connected to the emitter zones 13 and the base zone 12, respectively. Contact zones 19 which are associated with the base zone 12 and serve inter alia to reduce the base series resistance extend below the base digits 18 in the semiconductor body.

Figure 2:
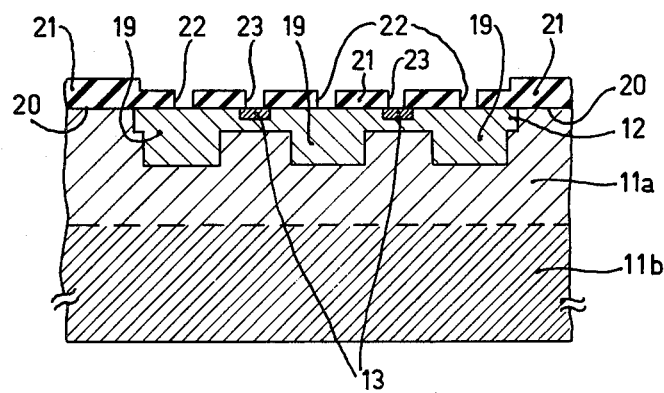
FIG. 2 is a diagrammatic cross-sectional view of the device taken on the line II—II of FIG. 1 in a stage of manufacture.

The dimensions of the emitter zones are, for example, 40 $\mu$m × 1.5 $\mu$m. The surface of the base zone is, for example, 45 $\mu$m × 31.5 $\mu$m. The contact zones 19 are, for example, 40 $\mu$m long and 5 $\mu$m wide. The width of the digits 17 and 18 is approximately 2 $\mu$m and the distance between two adjacent digits 17 and 18 is approximately 4 $\mu$m. In the cross-sectional view of FIG. 2 it is shown that the collector zone 11 consists of a low-ohmic substrate 11b and a high-ohmic epitaxial layer 11a of the same conductivity type.

The contact zones extend down to a depth of approximately 1 $\mu$m below the semiconductor surface 20. The remaining part of the base zone 12 has a thickness of approximately 0.3 $\mu$m. The emitter zones 13 are present in the thin part of the base zone 12 and are approximately 0.15 $\mu$m deep.

Present on the semiconductor surface is an insulating layer 21 in which apertures 22 and 23 having dimensions of approximately 40 $\mu$m × 1.5 $\mu$m are present for contacting the base zone and emitter zones, respectively.

Figure 3:
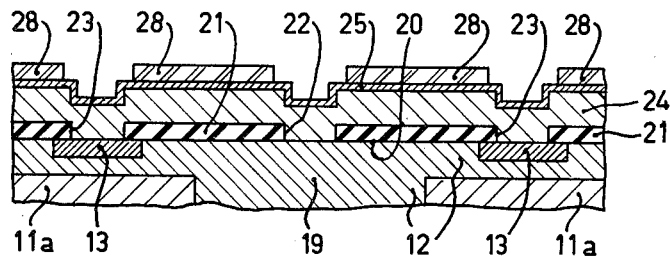
FIGS. 3 and 4 are diagrammatic cross-sectional views of a part of the device taken on the line II—II in FIG. 1 in later successive stages of manufacture.

The transistor described is manufactured by means of a method in which a masking layer 24, 25 (see FIG. 3) is provided on the surface 20 and comprises a first and a second masking sub-layer (24 and 25 respectively) of materials differing from each other, for example, a 1 $\mu$m thick aluminium layer 24 and a 0.1 to 0.2 $\mu$m thick chromium layer 25.

Figure 4:
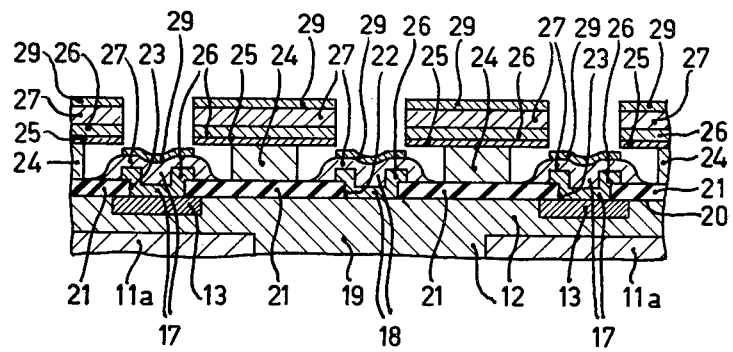

Upon masking recesses in the form of the conductor pattern that is to be provided in the masking layer 24, 25, for example, a photo-etching process is used in which recesses are made in the second masking sub-layer 25 by means of a layer 28 of photolacquer. The layer 28 of photolacquer or the second masking sub-layer 25 is then used as a mask for chemically etching the underlying first masking sub-layer 24 (see FIG. 4) dependent on the fact whether the layer 28 of photolacquer is removed after etching the layer 24 or the layer 25. A layer of conductive material 26, 27, 29 which comprises three conductive sub-layers 26, 27 and 29 of materials differing from each other, for example, a first 0.1 $\mu$m thick titanium layer 26, a second rhodium layer 27 the thickness of which reaches a value of 0.5 $\mu$m and a third 0.3 $\mu$m thick gold layer 29, is then provided on the said surface 20 and on the masking layer 24, 25. According to the invention this is carried out so that in the recess, conductive sub-layer 27 covers the whole free surface of the underlying first conductive sub-layer 26. The third conductive sub-layer 29 covers the second sub-layer 27 only partly and in its boundary corresponds to that of the first sub-layer 26.

The masking layer 24, 25 and hence the part of the conductive layer 26, 27, 29 present on the masking layer is then removed, the part of the conductive layer 26, 27, 29 present in the recesses of the masking layer 24, 25 remaining as the conductor pattern 14.

Figure 5:
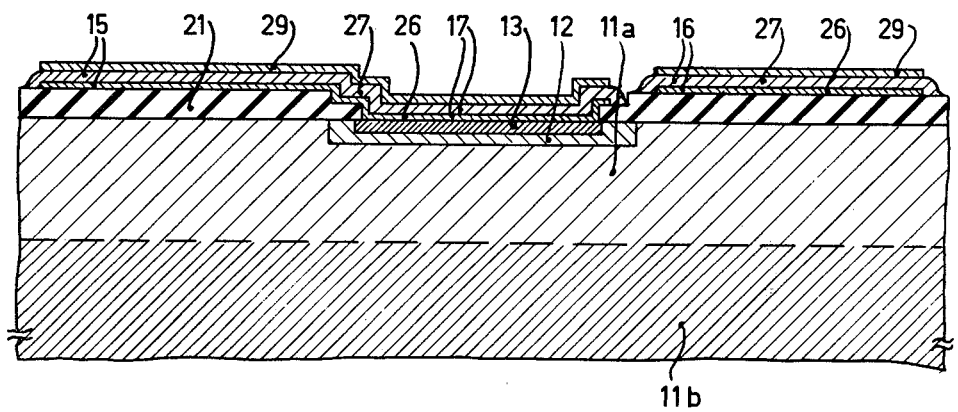
FIG. 5 is a diagrammatic cross-sectional view of the device taken on the line V—V of FIG. 1.

FIG. 5 is a cross-sectional view of the device in this stage of the manufacture. It is achieved inter alia in this manner that the first conductive sub-layer 26 can be protected from corrosion under the influence of the immediate atmosphere. The semiconductor device may further be treated in a usual manner and, for example, be finished and provided with an envelope. Gold wires for the emitter and the base may be provided on the contact pads 15 and 16. The collector zone 11a, b may be contacted on the lower side, for example, by soldering to a conductive bottom or pin of the envelope.

The conductive sub-layers are preferably provided at different pressures, the pressure during providing the first conductive sub-layer being smaller than the pressure during providing the second conductive sub-layer.

Good results are obtained in particular when the pressure during provision of the first conductive sublayer is $10^{-6}$ to $10^{-7}$ Torr and the pressure during provision of the second conductive sub-layer is $10^{-2}$ to $10^{-3}$ Torr.

If the material transport during provision of the first conductive sub-layer takes place mainly in a direction substantially at right angles to the surface to be covered, the edges of said first conductive sub-layer will be steep.

When the material source for providing the second conductive sub-layer has relatively the same position with respect to the surface to be covered as the material source for providing the first conductive sub-layer, then, when the above-mentioned pressures are used, the second conductive sub-layer will have inclined edges and will enclose the first conductive sub-layer. The second conductive sub-layer may be provided by vapour deposition or by sputtering.

The second conductive sub-layer may overlap the first conductive sub-layer in a lateral direction over a distance of, for example, 0.1 μm.

In another preferred embodiment, the material sources for providing the conductive sub-layers are not in relatively equal position relative to the surface to be covered, but a larger maximum angle of incidence is used for the material transport to the surface upon providing the second conductive sub-layer than is used for providing the first conductive sub-layer.

In this case, for example, the first conductive sub-layer is vapor-deposited, for example, substantially at right angles to the surface and the second conductive sub-layer is vapor-deposited at an angle with the normal to the surface. The surface to be covered may perform a rotating or even a planetary movement or an annular vapour deposition source may be used.

In a preferred embodiment of the method according to the invention the masking layer comprises three masking sub-layers of materials differing from each other.

An example in which such a masking layer is used can be given in close connection with the already given example.

In this case the layer 28 of photolacquer is not removed after etching the layer 24 or 25, but is used as a third masking sub-layer which masks during etching the second masking sub-layer 25 and the second masking sub-layer 25, after removing the third masking sub-layer 28 and providing the first conductive sub-layer 26, serves as a mask while providing the second conductive sub-layer 27 and a possible third conductive sub-layer 29.

In the last-mentioned there can be used a particular type of vapor-deposition method for providing the conductive sub-layers, namely vapor-deposition at $10^{-6}$ to $10^{-7}$ Torr, and a material transport substantially at right angles to the surface to be covered. In fact, the third masking sub-layer has narrower apertures than the second which is underetched below the third. As a result of this the vapour-deposited second conductive sub-layer will cover the whole free surface of the first conductive sub-layer.

Of course, the third masking sub-layer need not consist of photolacquer and for that purpose may be chosen a material differing from that of the other two masking sub-layers.

The method according to the invention is not restricted to the embodiments described but may be varied in many manners without departing from the scope of this invention.

For example, copper, silver, magnesium or titanium may be used, besides aluminium, as a material for the first masking sub-layer and, for example, palladium, molybdenum, tungsten, tantalum or nickel may be used, besides chromium, as a material for the second.

As the first conductive sub-layer there may be used, besides titanium, for example, aluminium, chromium, tantalum, tungsten, molybdenum, zirconium, cobalt or hafnium, while platinum, rhodium, ruthenium, palladium, irridium, osmium or rhenium may be used for the second conductive sub-layer.

In order to obtain conductor tracks which are present very close together, adjacent tracks may be provided in successive phases in which the method according to the invention is used in each phase.

What is claimed is:

1. A method of manufacturing a device comprising a body which has a conductor pattern, comprising the steps of:
   (a) providing said body having a surface,
   (b) providing a masking layer on said surface, said masking layer comprising at least first and second masking sub-layers of respective materials differing from each other, said first masking sub-layer underlying said second masking sub-layer and being of metal,
   (c) providing in said masking layer recesses in the form of said conductive pattern that is to be provided,
   (d) etching said first masking sub-layer, using said second masking sub-layer as an etching mask for the underlying first masking sub-layer, exposing part of said body surface,
   (e) thereafter providing a layer of conductive material on the exposed said surface and on said masking layer, said conductive layer comprising plural conductive sub-layers of respective materials differing from each other, said step of providing said conductive layer comprising providing a first conductive sub-layer on said surface and then providing a second conductive sub-layer which covers the whole free surface of the underlying said first conductive sub-layer such that said first conductive sub-layer is completely shielded from the environment by said second conductive sublayer, and
   (f) then removing said masking layer and a first part of said conductive layer present on said masking layer so that a second part of said conductive layer present in said recesses of said masking layer remains on said body as said conductive pattern,
   wherein said step of providing said conductive layer comprises providing said first and second conductive sub-layers at different respective pressures, the pressure during the provision of said first conductive sub-layer being smaller than the pressure during the provision of said second conductive sub-layer.

2. A method as in claim 1, wherein the pressure during the provision of said first conductive sub-layer is $10^{-6}$ to $10^{-7}$ Torr and the pressure during the provision of said second conductive sub-layer is $10^{-2}$ to $10^{-3}$ Torr.

* * * * *